(12) United States Patent
Kim et al.

(10) Patent No.: US 11,158,264 B2
(45) Date of Patent: Oct. 26, 2021

(54) DISPLAY DEVICE

(71) Applicant: LG ELECTRONICS INC., Seoul (KR)

(72) Inventors: Wontae Kim, Seoul (KR); Heumseok Baek, Seoul (KR); Jongup Lee, Seoul (KR); Insuk Jeong, Seoul (KR); Jeonghwan Hwang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/868,166

(22) Filed: May 6, 2020

(65) Prior Publication Data

US 2020/0265785 A1 Aug. 20, 2020

Related U.S. Application Data

(63) Continuation of application No. 15/997,985, filed on Jun. 5, 2018, now Pat. No. 10,672,342.

(30) Foreign Application Priority Data

Jul. 20, 2017 (KR) .......................... 10-2017-0092214

(51) Int. Cl.
*G09G 3/3266* (2016.01)
*G09G 3/3225* (2016.01)
(Continued)

(52) U.S. Cl.
CPC ......... *G09G 3/3266* (2013.01); *G09G 3/3225* (2013.01); *G09G 3/3275* (2013.01);
(Continued)

(58) Field of Classification Search
CPC .. G09G 3/3266; G09G 3/3225; G09G 3/3275; G09G 2300/0408;
(Continued)

(56) References Cited

U.S. PATENT DOCUMENTS 5,719,648 A * 2/1998 Yoshii ................... G02F 1/1309
349/42
6,692,326 B2 2/2004 Choi et al.
(Continued)

FOREIGN PATENT DOCUMENTS

| EP | 2669884 | 12/2013 |
|---|---|---|
| EP | 2911200 | 8/2015 |
| EP | 3187928 | 7/2017 |

OTHER PUBLICATIONS

European Patent Office Application Serial No. 18182180.2, Search Report dated Nov. 27, 2018, 7 pages.

(Continued)

*Primary Examiner* — Ricardo Osorio
(74) *Attorney, Agent, or Firm* — Lee, Hong, Degerman, Kang & Waimey

(57) ABSTRACT

A display device is disclosed. The display device of the present invention may comprise: a substrate including a display area and a non-display area adjacent to the display area; an anode electrode being positioned in the display area; an organic light emitting layer being layered on the anode electrode, the organic light emitting layer being positioned in the display area; a cathode electrode being layered on the organic light emitting layer; and a gate driver being positioned in the display area.

9 Claims, 10 Drawing Sheets

(51) Int. Cl.
*H01L 27/12* (2006.01)
*H01L 27/32* (2006.01)
*G09G 3/3275* (2016.01)

(52) U.S. Cl.
CPC ........ *H01L 27/124* (2013.01); *H01L 27/1251* (2013.01); *H01L 27/3244* (2013.01); *H01L 27/3248* (2013.01); *H01L 27/3258* (2013.01); *H01L 27/3262* (2013.01); *G09G 2300/0408* (2013.01); *G09G 2310/0281* (2013.01); *H01L 2251/5315* (2013.01)

(58) Field of Classification Search
CPC .......... G09G 2310/0281; H01L 27/124; H01L 27/1251; H01L 27/3244; H01L 27/3248; H01L 27/3258; H01L 27/3262; H01L 2251/5315
See application file for complete search history.

(56) References Cited

U.S. PATENT DOCUMENTS

| | | | |
|---|---|---|---|
| 6,861,810 B2 | 3/2005 | Rutherford | |
| 8,279,145 B2* | 10/2012 | Cok | H01L 27/3255 345/82 |
| 9,614,022 B2 | 4/2017 | Miyake et al. | |
| 10,211,268 B1 | 2/2019 | Rutherford | |
| 10,255,863 B2* | 4/2019 | Song | G09G 3/3611 |
| 10,396,310 B2 | 8/2019 | Choi et al. | |
| 10,672,342 B2 | 6/2020 | Kim et al. | |
| 2003/0098833 A1* | 5/2003 | Sekido | G09G 3/3688 345/87 |
| 2010/0265224 A1* | 10/2010 | Cok | B32B 37/12 345/206 |
| 2011/0248968 A1 | 10/2011 | Suh | |
| 2012/0268445 A1 | 10/2012 | Ogata et al. | |
| 2013/0146931 A1 | 6/2013 | Liu et al. | |
| 2013/0321499 A1* | 12/2013 | Park | G09G 3/3688 345/698 |
| 2014/0078123 A1* | 3/2014 | Park | G02F 1/13454 345/205 |
| 2014/0139413 A1 | 5/2014 | Kwon et al. | |
| 2014/0239317 A1 | 8/2014 | Bang et al. | |
| 2015/0130785 A1* | 5/2015 | Shin | G09G 5/18 345/213 |
| 2015/0160766 A1* | 6/2015 | Park | G09G 3/3666 345/173 |
| 2015/0310821 A1* | 10/2015 | Kim | G09G 3/3677 345/212 |
| 2016/0071614 A1* | 3/2016 | Lee | G11C 19/28 345/214 |
| 2016/0141315 A1* | 5/2016 | Shin | H01L 29/66969 257/43 |
| 2016/0172428 A1* | 6/2016 | Song | H01L 27/3276 257/99 |
| 2016/0182042 A1* | 6/2016 | Kim | G11C 19/28 345/213 |
| 2016/0266450 A1* | 9/2016 | Kim | G02F 1/133512 |
| 2016/0267831 A1 | 9/2016 | Seo et al. | |
| 2016/0307544 A1* | 10/2016 | Lin | G09G 5/363 |
| 2016/0307937 A1* | 10/2016 | Jin | H01L 27/124 |
| 2017/0025070 A1 | 1/2017 | Kang et al. | |
| 2017/0047033 A1* | 2/2017 | Tanaka | G02F 1/136286 |
| 2017/0047038 A1* | 2/2017 | Noma | G09G 3/3688 |
| 2017/0062546 A1* | 3/2017 | Kim | G09G 3/3233 |
| 2017/0193939 A1* | 7/2017 | Lee | G11C 19/287 |
| 2017/0255074 A1* | 9/2017 | Nishiyama | G02F 1/13454 |
| 2017/0278913 A1 | 9/2017 | Zhang | |
| 2017/0287381 A1* | 10/2017 | Park | G09G 3/3677 |
| 2017/0287387 A1* | 10/2017 | Eguchi | G02B 26/0833 |
| 2019/0237489 A1* | 8/2019 | Matsukizono | H01L 27/3262 |

OTHER PUBLICATIONS

U.S. Appl. No. 15/997,985, Office Action dated Oct. 3, 2019, 14 pages.

* cited by examiner

DISPLAY DEVICE

This application is a continuation of U.S. patent application Ser. No. 15/997,985, filed on Jun. 5, 2018, which claims the benefit of earlier filing date and right of priority to Korean Patent Application No. 10-2017-0092214, filed on Jul. 20, 2017, the contents of which are hereby incorporated by reference herein in its entirety.

BACKGROUND OF THE INVENTION

Field of the Invention

The present invention relates to a display device.

Discussion of the Related Art

In recent years, various display devices capable of reducing weight and volume, which are disadvantages of cathode ray tubes (CRTs), have been developed. For example, the display device can be a liquid crystal display (LCD), a field emission display (FED), a plasma display panel (PDP), or an electro-luminescence device EL).

The display device may be divided into a display area for displaying an image and a non-display area formed along an outer periphery of the display area.

In a conventional display device, a panel driver for driving a display panel is disposed in the non-display area. Since the panel driver is disposed in the non-display area, it is restrictive for the non-display area to be reduced.

SUMMARY OF THE INVENTION

Accordingly, an object of the present disclosure is to address the above-described and other problems.

Another object of the present disclosure is to provide a display device forming narrow bezel, wherein the gate driver is positioned in the display area, wherein the conventional date driver is positioned in the non-display area.

According to an aspect of the present invention, there is provided a display device, comprising: a substrate including a display area and a non-display area adjacent to the display area; an anode electrode being positioned in the display area; an organic light emitting layer being layered on the anode electrode, the organic light emitting layer being positioned in the display area; a cathode electrode being layered on the organic light emitting layer; and a gate driver being positioned in the display area.

According to another aspect of the present invention, the display device may further comprise a driving TFT (thin film transistor) positioned in the display area, and the driving TFT may include: a D-drain electrode being connected to the anode electrode; a D-source electrode; a D-gate electrode; and a D-semiconductor layer, and the gate driver may be layered on the substrate, and the driving TFT may be layered on the gate driver.

According to another aspect of the present invention, the gate driver may include a plurality of gate TFT (thin film transistor), each of the plurality of gate TFT may include: a G-semiconductor layer; a G-gate electrode; a G-source electrode; and a G-drain electrode being connected to the D-gate electrode.

According to another aspect of the present invention, the display device may further comprise: a protective layer covering the gate driver; and a planarizing layer being layered on the protective layer, the driving TFT may be formed on the planarizing layer, the G-drain electrode may pass through the protective layer and the planarizing layer, and the G-drain electrode may be connected to the D-gate electrode.

According to another aspect of the present invention, the gate driver may be positioned at a central portion of the display area, and the gate driver may be elongated along a column direction of the display area.

According to another aspect of the present invention, the gate driver may include a first gate driver and a second gate driver, the first gate driver may be positioned at a side of the display area, the second gate driver may be positioned at another side of the display area, and the second gate driver may be located opposite to the first gate driver.

According to another aspect of the present invention, the display device may further comprise: a lower first insulator; a lower second insulator; a lower protective layer; and a lower planarizing layer, the G-semiconductor layer may be formed on the substrate, the lower first insulator may be applied on the substrate and the lower first insulator may cover the G-semiconductor layer, the G-gate electrode may be formed on the lower first insulator, the lower second insulator may be applied on the lower first insulator and the lower first insulator may cover the G-gate electrode, the G-source electrode may be formed on the lower second insulator, the G-source electrode may pass through the lower first and second insulators, and the G-source electrode may be connected to an upper surface of the G-semiconductor layer, the G-drain electrode may be formed on the lower second insulator, the G-drain electrode may pass through the lower first and second insulators, the G-drain electrode may be connected to the upper surface of the G-semiconductor layer, and the G-drain electrode may be spaced apart from the G-source electrode, the lower protective layer may cover the G-source electrode and the G-drain electrode, and the lower protective layer may be layered on the lower second insulator, and the lower planarizing layer may be layered on the lower protective layer.

According to another aspect of the present invention, the display device may further comprise: an upper first insulator; an upper second insulator; an upper protective layer; and an upper planarizing layer, the D-semiconductor layer may be formed on the lower planarizing layer, the upper first insulator may be layered on the lower planarizing layer, the upper first insulator may cover the D-semiconductor layer, the D-gate electrode may be formed on the upper first insulator, the D-gate electrode may be connected to the G-drain electrode, the upper second insulator may be layered on the upper first insulator, the upper second insulator may cover the D-gate electrode, the D-source electrode may be formed on the upper second insulator, the D-source electrode may pass through the upper first and second insulators, the D-source electrode may be connected to the D-semiconductor layer, the D-drain electrode may be formed on the upper second insulator, the D-drain electrode may pass through the upper first and second insulators, the D-drain electrode may be connected to the D-semiconductor layer, the D-drain electrode may be spaced apart from the D-source electrode, the upper protective layer may be layered on the upper second insulator, the upper protective layer may cover the D-source electrode and the D-drain electrode, the upper planarizing layer may be layered on the upper protective layer, and the anode electrode may be formed on the upper planarizing layer and connected to the D-drain electrode.

According to another aspect of the present invention, the D-semiconductor layer may include a first D-semiconductor layer and a second D-semiconductor layer, the first D-semiconductor layer may be spaced apart from the second D-semiconductor layer, the D-source electrode may be connected to the first D-semiconductor layer, and the D-drain electrode may be connected to the second D-semiconductor layer.

According to another aspect of the present invention, the display device may further comprise: an upper first insulator; an upper protective layer; and an upper planarizing layer, the driving TFT may further include a D-etch stopper layer, the D-gate electrode may be formed on the lower planarizing layer, the upper first insulator may be layered on the lower planarizing layer, the upper first insulator may cover the D-gate electrode, the D-semiconductor layer may be formed on the upper first insulator, the D-etch stopper layer may be formed on the D-semiconductor layer, the D-source electrode may be formed on the upper first insulator, the D-source electrode may cover a side of the D-semiconductor layer and a side of the D-etch stopper layer, the D-drain electrode may be formed on the upper first insulator, the D-drain electrode may cover another side of the D-semiconductor layer and another side of the D-etch stopper layer, the upper protective layer may be layered on the upper first insulator, and the upper protective layer may cover the D-source electrode and the D-drain electrode, the upper planarizing layer may be layered on the upper protective layer; and the anode electrode may be formed on the upper planarizing layer and connected to the D-drain electrode.

According to another aspect of the present invention, the display device may further comprise: a lower first insulator; a lower protective layer; and a lower planarizing layer, the gate TFT may further include a G-etch stopper layer, the G-gate electrode may be formed on the substrate, the lower first insulator may be layered on the substrate, the lower first insulator may cover the G-gate electrode, the G-semiconductor layer may be formed on the lower first insulator, the G-etch stopper layer may be formed on the G-semiconductor layer, the G-source electrode may be formed on the lower first insulator, the G-source electrode may cover a side of the G-semiconductor layer and a side of the G-etch stopper layer, the G-drain electrode may be formed on the lower first insulator, the G-drain electrode may cover another side of the G-semiconductor layer and another side of the G-etch stopper layer, the lower protective layer may be layered on the lower first insulator, the lower protective layer may cover the D-source electrode and the D-drain electrode, and the lower planarizing layer may be layered on the lower protective layer.

According to another aspect of the present invention, the D-semiconductor layer may include a first D-semiconductor layer and a second D-semiconductor layer, the first D-semiconductor layer may be spaced apart from the second D-semiconductor layer, the D-source electrode may be connected to the first D-semiconductor layer, and the D-drain electrode may be connected to the second D-semiconductor layer.

According to another aspect of the present invention, the display device may further comprise a data driver being positioned in the non-display area, the data driver may be electrically connected to the gate driver.

According to another aspect of the present invention, the data driver may include: a first data driver; and a second data driver being spaced apart from the first data driver.

According to another aspect of the present invention, the display device may further comprise a source COF (Chip On Film) being positioned in the non-display area, and the source COF may connect the data driver to the substrate.

According to at least one embodiment of the present invention, by forming the gate driver (which is conventionally positioned in the non-display area) in the display area, narrow bezel can be accomplished easily.

According to at least one of the embodiments of the present invention, the design autonomy of the product can be improved by forming the gate driver (which is conventionally formed in the non-display area) in the display area.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
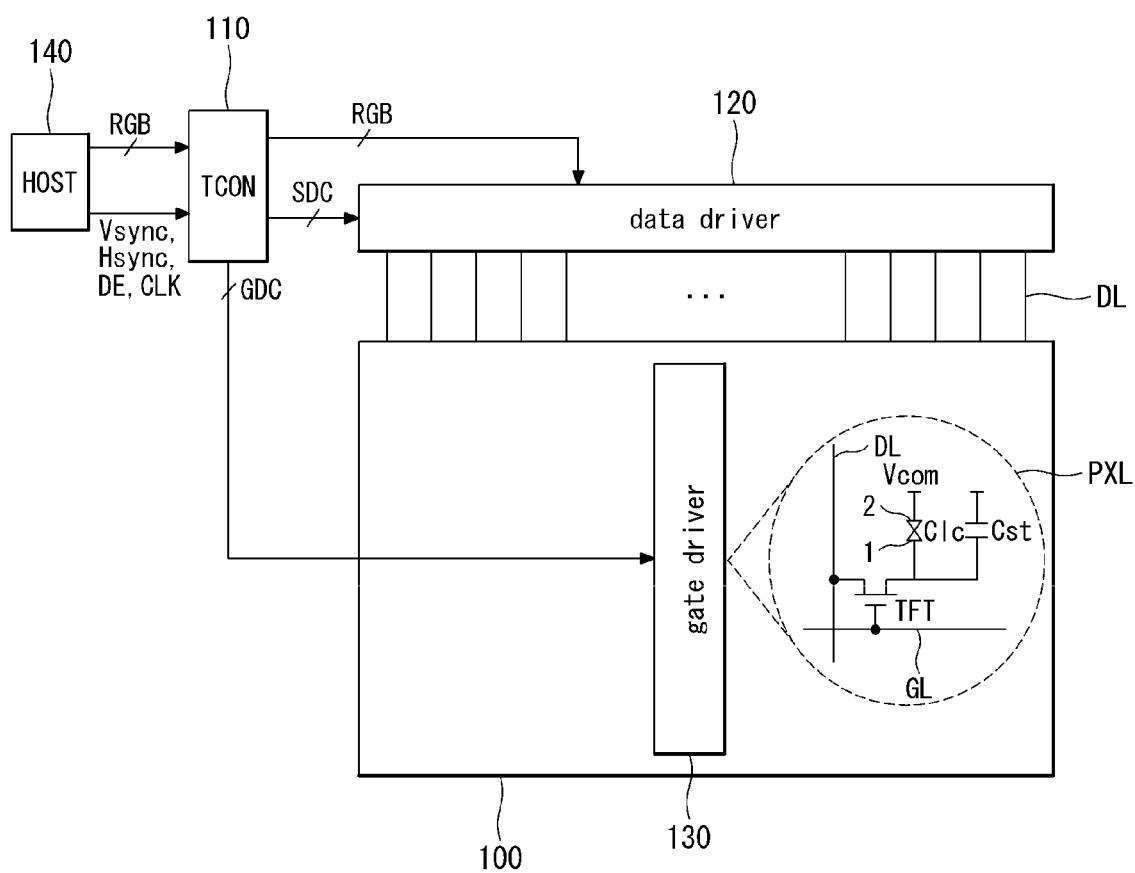
FIGS. 1 and 2 are views illustrating the display device according to an embodiment of the present invention.

Reference will now be made in detail embodiments of the invention examples of which are illustrated in the accompanying drawings. Since the present invention may be modified in various ways and may have various forms, specific embodiments are illustrated in the drawings and are described in detail in the present specification. However, it should be understood that the present invention are not limited to specific disclosed embodiments, but include all modifications, equivalents and substitutes included within the spirit and technical scope of the present invention.

The terms 'first', 'second', etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed.

When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following exemplary embodiments of the present invention are provided to those skilled in the art in order to describe the present invention more completely. Accordingly, shapes and sizes of elements shown in the drawings may be exaggerated for clarity.

Referring to FIG. 1, the display device may include: a display panel 100 on which a pixel array is formed; and panel driver 110, 120, and 130 for providing input digital video data to the display panel 100.

The pixel array of the display panel 100 can display an image from input digital video data. The pixels PXL of the pixel array can be arranged in a matrix form defined by the intersection structure of the data lines DL and the gate lines GL. The pixel PXL may include a pixel electrode 1 to which a data voltage is supplied, at least one thin film transistor (TFT) that operates as a switching element and/or a driving element, and a capacitor Cst. The pixel PXL may be connected to the common electrode 2. The common electrode 2 can supply the common voltage Vcom to the pixels. The liquid crystal cell Clc can be driven by the electric field between the pixel electrode 1 to which the data voltage is supplied and the common electrode 2 to which the common voltage Vcom is supplied.

The panel driver 110, 120 and 130 may include a data driver 120, a gate driver 130, and a timing controller 110.

The data driver 120 may be disposed around the display panel 100. The data driver 120 may be disposed above or below the display panel 100. The data driver 120 may be under the control of the timing controller 110. The data driver 120 may reverse the polarity of the data voltage to be supplied to the pixels PXL and output the data voltages to the data lines DL. For example, the data driver 120 may include a plurality of source drive ICs (Integrated Circuits).

The gate driver 130 may be disposed inside the display panel 100. The gate driver 130 may be disposed in a display area where an image is displayed. The gate driver 130 may supply a gate signal or a scan signal to the gate lines GL under the control of the timing controller 110. For example, the gate driver 130 may include a plurality of gate drive ICs. The gate driver 130 may be referred to as a GIP (Gate In Panel). The GIP 130 may be composed of a plurality of thin film transistor.

A timing controller 110 may receive input digital video data and timing signals Vsync, Hsync, DE, and CLK synchronized with the input digital video data from a host system 140. For example, the timing signals Vsync, Hsync, DE, and CLK may include: a vertical synchronization signal Vsync; a horizontal synchronization signal Hsync; a data enable signal DE; and a main clock CLK.

The timing controller 110 may transmit the input digital video data received from the host system 140 to the data driver 120.

The timing controller 110 may generate the source timing control signal SDC and the gate timing control signal GDC based on the timing signals Vsync, Hsync, DE, and CLK. The timing control signal SDC can control the operation timing of the data driver 120. The gate timing control signal GDC can control the operation timing of the gate driver 130.

The source timing control signal SDC may include a plurality of source signals. The source timing control signal SDC may include a source start pulse (SSP), a source sampling clock (SSC), a polarity control signal, and a source output enable signal (SOE).

The source start pulse (SSP) can control the start timing of the shift register built in the data driver 120. The source sampling clock (SSC) can control the sampling timing of the data. The polarity control signal can control the polarity of the data voltage from the data driver 120. The source output enable signal (SOE) can control the output timing of the data voltage.

The gate timing control signal (GDC) may include a plurality of gate signals. The gate timing control signal (GDC) may include a gate start pulse (GSP), a gate shift clock (GSC) and a gate output enable signal (GOE).

The gate start pulse (GSP) can control the start timing of the shift register. The gate shift clock (GSC) can control the shift timing of the shift register. The gate output enable signal (GOE) may define the output timing of the gate signals.

The host system 140 may provide input digital video data and various timing signals (Vsync, Hsync, DE, CLK) so that the display panel 100 can display an image. For example, the host system 140 may be any one of a TV system, a set top box, a navigation system, a DVD player, a Blu-ray player, a personal computer (PC), a home theater system.

Figure 2:
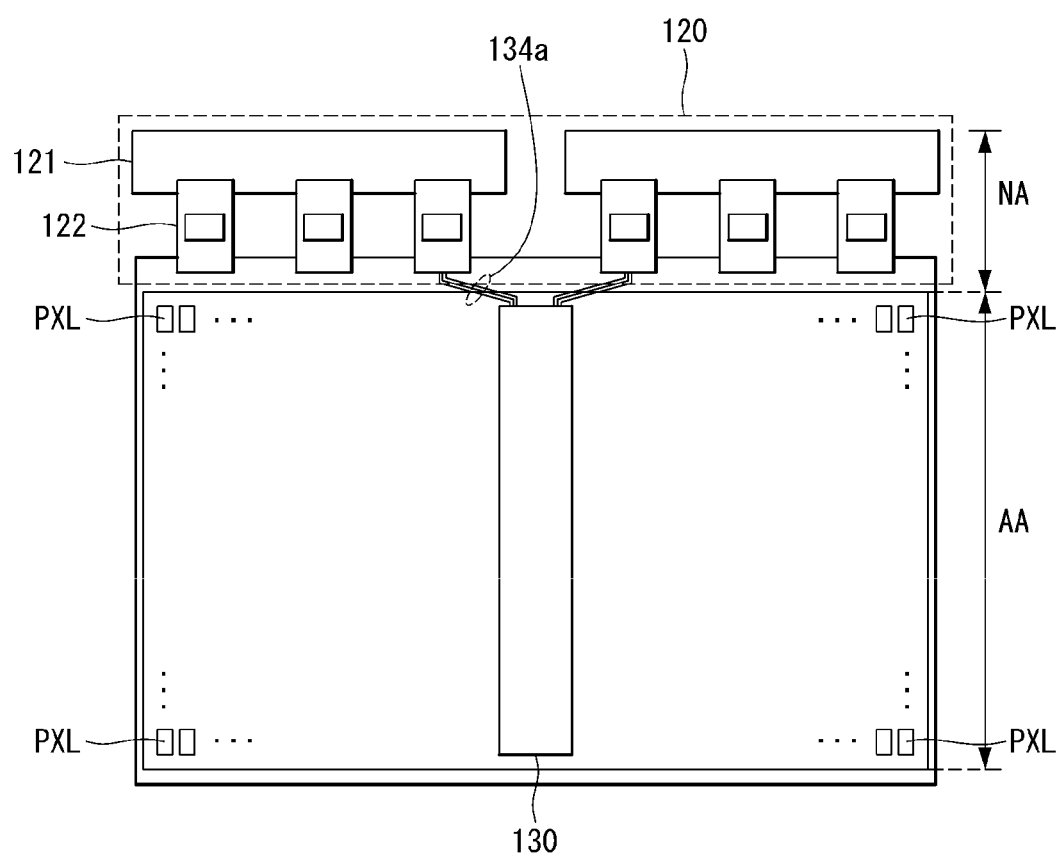
Figure 5:
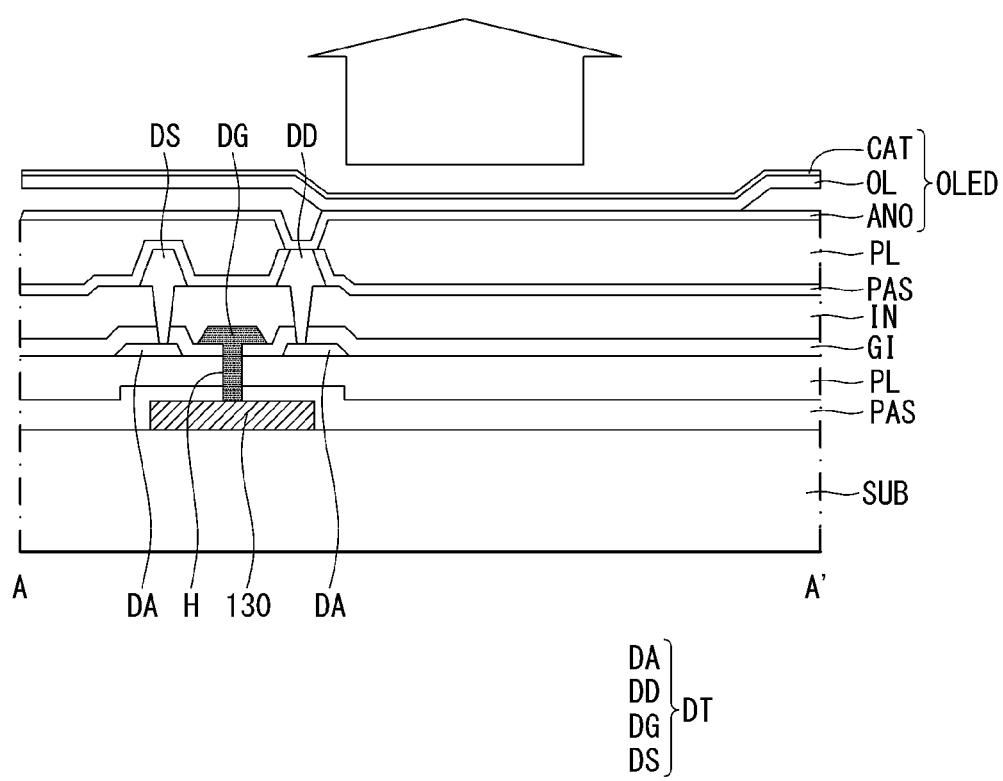
FIGS. 5 to 9 are sectional views of FIG. 4 for illustrating various embodiments of the present invention.

Referring to FIG. 2, the display panel 100 may include a substrate SUB (see FIG. 5). The display panel 100 or the substrate SUB (see FIG. 5) may include a display area AA for displaying an image of input digital video data and a non-display area NA for arranging various electric components for driving the display area AA. The non display area NA can be referred to as a bezel area (BA).

The plurality of pixels PXL may be arranged on the display area AA in a matrix form. For example, the plurality of pixels PXL may be arranged in M×N rectangular shape. M and N can be natural numbers. N may be greater than M.

A gate driver 130 may be disposed at a central portion of the display area AA. The gate driver 130 may be elongated along a column direction Y of the display area AA.

The gate driver 130 may include a plurality of thin film transistors. The gate driver 130 may be mounted on the substrate SUB (see FIG. 5). The gate driver 130 may be disposed below the pixel PXL. The gate driver 130 may be positioned between the substrate SUB and the pixel PXL.

The gate driver 130 may be electrically connected to the plurality of wires 134a. The plurality of wires 134a can transmit a driving signal or a control signal to the gate driver 130. The plurality of wires 134a may be electrically connected to the data driver 120 and the source COF (Chip On Film) 122.

The plurality of wires 134a may be connected to the source COF (Chip On Film) 122 disposed closest to the periphery of the gate driver 130 in consideration of noise and signal delay.

The driving signal or the control signal may be supplied to the gate driver 130 via the data driver 120, the source COF (Chip On Film) 122 and the plurality of wires 134a.

The non-display area NA can be disposed on the periphery of the pixel array or around the pixel PXL. The non-display area NA may be disposed on a side of the pixel PXL in the column direction. A data driver 120 may be disposed on the non-display area NA. The data driver 120 may be elongated along the left and right direction X extending from the left to the right of the display area. The data driver 120 may supply a signal corresponding to image information to the data lines DL.

The data driver 120 may include a plurality of source drive ICs (Integrated Circuit) 121. For example, the source drive IC 121 may be coupled to a data pad 123 (see FIG. 3) via a source COF (Chip-On-Film) 122. The plurality of source drive ICs 121 may be spaced in the lateral direction X. The source drive ICs 121 may be connected to the data lines DL via a source COF 122 and a data pad 123 (see FIG. 3).

The conventional gate driver 130 has been positioned on both sides of the display area AA to form a non-display area NA. By disposing the gate driver 130 according to an embodiment of the present invention on the display area AA, the bezel can be relatively reduced.

Figure 3:
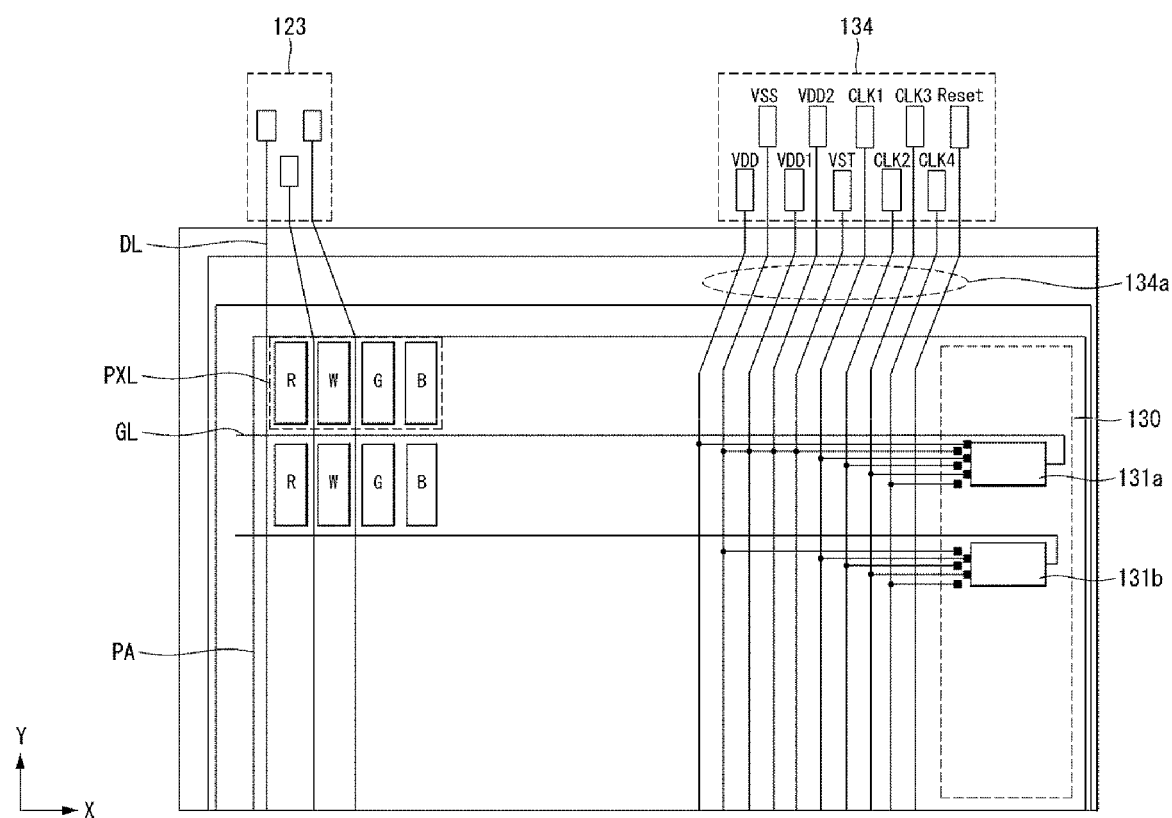
FIG. 3 is a view of relation of the gate driver and the plurality of wires.

Referring to FIG. 3, the pixel PXL may include a plurality of sub-pixels. The plurality of sub-pixels may be regularly arranged.

For example, the pixel PXL may include three sub-pixels representing RGB (red, green, and blue) hue. As another example, the pixel PXL may include four subpixels representing RGBW (red, green, blue, and white) colors.

The data driver 120 (see FIG. 2), the data pad 123, and the gate pad 134 may be disposed on the non-display area NA.

The data pad 123 may correspond to a plurality of data lines DL. The data pad 123 may be formed at an end of each of the plurality of data lines DL. The plurality of data pads 123 may be spaced apart from each other at regular spacing. The plurality of data pads 123 may be arranged in a plurality of rows to secure spacing between neighboring data lines DL.

The gate pad 134 may correspond to a plurality of wires. The gate pad 134 may be formed at each end of the plurality of wires. For example, the plurality of wires may include: a first clock wire CLK1 to a fourth clock wire CLK4; a reset wire Reset, a data start wire VST; a driving wire VDD; a first driving wire VDD1; a second driving wire VDD2; and a base wire VSS.

For example, among the plurality of wires, the base wire VSS may be disposed inside the substrate SUB (see FIG. 5) together with the GIP 130 or at the outermost portion of the substrate SUB (see FIG. 5). The base wire VSS can supply the base voltage or the ground voltage GND. The base wire VSS can be supplied with a ground voltage supplied from the outside of the substrate SUB (see FIG. 5), and can supply the ground voltage to the data driver 120 (see FIG. 2) and the GIP 130. The base wire VSS may be connected to the data driver 120 (see FIG. 2) disposed on the upper side of the substrate SUB and to the GIP 130 disposed inside the substrate SUB.

The plurality of wires may be spaced apart from each other at regular spacing. The gate pad 134 may be arranged in a plurality of rows to secure spacing between the plurality of wires.

The GIP 130 may receive a plurality of driving signals or control signals from a plurality of wires electrically connected through the gate pad 134 and may supply a scan signal to the gate lines GL. The GIP 130 may include a plurality of thin film transistor 131a and 131b.

Each of the plurality of thin film transistors 131a and 131b may be electrically connected to the plurality of wires through the gate pad 134.

The gate pad 134 may be spaced apart from the data pad 123. The gate pad 134 and the data pad 123 may be arranged long in the left-right direction X.

Figure 4:
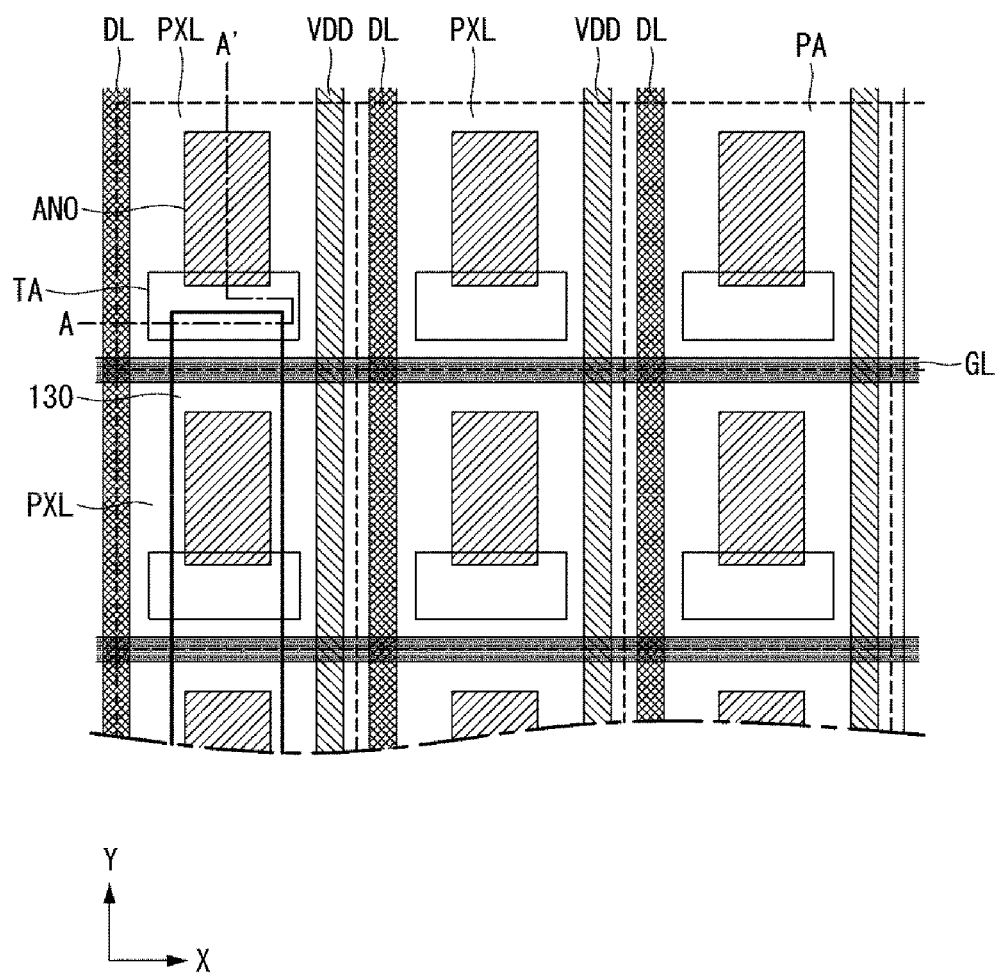
FIG. 4 is a view of schematic of pixels according to an embodiment of the present invention.

Referring to FIGS. 4 and 5, the plurality of pixels PXL may be arranged on the display area AA in a matrix form. The arrow in FIG. 5 indicates the direction of light emission.

A plurality of gate lines GL running in the left and right direction X (row direction) intersect with the plurality of data lines DL and the driving current line VDD running in the vertical direction Y (column direction). The pixels PXL may be compartmentalized by the gate line GL. The pixels PXL may be compartmentalized by the data line DL or the driving current line VDD. The pixels PXL may be compartmentalized by the boundary (or between) the data line DL and the driving current line VDD.

Each pixel PXL may have the same size or different sizes. A region on which least one pixel PXL is positioned can be referred to as a pixel region PA. For example, the region on which the plurality of pixels PXL are positioned can be referred to as the pixel region PA. The pixel region PA can have a rectangular shape. The pixel region PA can be formed on substrate SUB. The pixel region PA can be formed in inside of the display area AA. For example, the pixel region PA can stand for the display area AA.

The gate driver 130 (see FIG. 3) may be formed in inside of the substrate SUB.

Thin film transistors for driving the organic light emitting diode (OLED) may be disposed in each pixel PXL. The thin film transistors may be formed on the TFT (thin film transistor) area TA located in the pixel PXL. For example, the thin film transistors may include a switching TFT (not shown) and a driving TFT DT (see FIG. 5).

The organic light emitting diode OLED may include an anode electrode ANO, a cathode electrode CAT, and an organic light emitting layer OL interposed between the two electrodes. The region where light is actually emitted from OLED can be determined by the area of the organic light emitting layer OL overlapping with the anode electrode ANO.

The anode electrode ANO may occupy a certain area of the pixel PXL. The anode electrode ANO may be connected to a thin film transistor formed on the thin film transistor region TA. The organic light emitting layer OL may be formed on the anode electrode ANO. The region where the anode electrode ANO and the organic light emitting layer OL overlap may be a light emitting region. The cathode electrode CAT on the organic light emitting layer OL may cover the entire area of the display area AA on which the pixels PXL are arranged.

The cathode electrode CAT can be in contact with the base wire VSS (see FIG. 3). The base voltage can be applied to the cathode electrode CAT via the base wire VSS (see FIG. 3). The cathode electrode CAT can receive a base voltage. The anode electrode ANO can receive the image voltage.

The voltage difference between the cathode electrode CAT and the anode electrode ANO can induce the organic light emitting layer OL to emit light. The image can be displayed by the light from the organic light emitting layer OL.

The gate driver 130 (see FIG. 3) may overlap the TFT region TA. The gate driver 130 (see FIG. 3) may be connected to the thin film transistor formed in the thin film transistor region TA.

Figure 6:
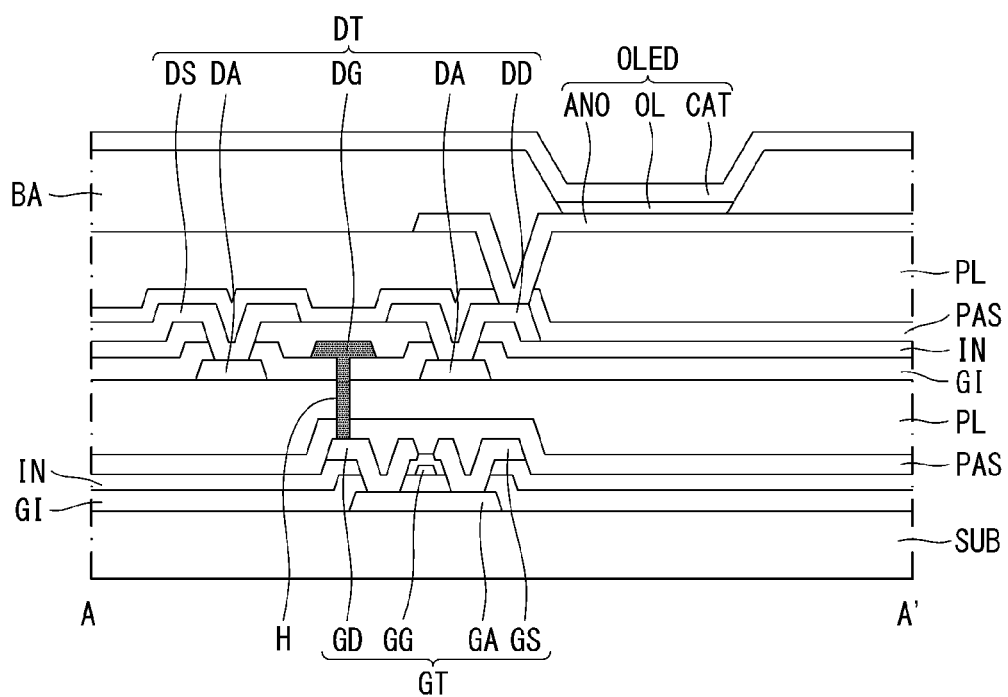

The gate driver 130 (see FIG. 3) may include a plurality of GIP thin film transistors GT (see FIG. 6). The GIP thin film transistor GT may have the same configuration as the switching TFT (not shown) or the driving TFT DT. The 'GIP thin film transistor' can be referred to as a 'G-TFT' or 'GIP TFT' or 'gate TFT'.

The plurality of G-TFTs GT can be electrically arranged with respect to each other. A gate driver 130 (see FIG. 3) composed of a plurality of G-TFTs GT may be elongated in the column direction Y and overlap the pixel PXL.

Referring to FIG. 5, the display device may include a thin film transistor and an organic light emitting diode OLED connected to the thin film transistor.

The thin film transistor element may include a switching TFT (not shown), a driving TFT DT connected to the switching TFT, and GIP-TFT GT (see FIG. 6).

A switching TFT (not shown) can select a pixel. The switching TFT (not shown) may include a gate electrode, a semiconductor layer, a source electrode, and a drain electrode. The gate electrode can be branched from the gate line GL.

The configuration of the switching TFT (not shown) may be substantially the same as the configuration of the driving TFT DT.

The driving TFT DT can drive the pixel selected by the switching TFT (not shown). The driving TFT DT may include a gate electrode DG, a semiconductor layer DA, a source electrode DS, and a drain electrode DD. The gate electrode DG may be connected to the gate driver 130. The source electrode DS may be connected to the anode electrode ANO of the organic light emitting diode. Although not shown in FIG. 5, the gate electrode DG of the driving TFT DT may be connected to a drain electrode (not shown) of a switching TFT (not shown). The drain electrode DD of the driving TFT DT may be connected to the driving wire VDD (see FIG. 4). The drain electrode DD of the driving TFT DT may be referred to as a D-drain electrode DD. The source electrode DS of the driving TFT DT may be referred to as a D-source electrode DS. The gate source DG of the driving TFT DT may be referred to as a D-gate electrode DG. The semiconductor layer DA of the driving TFT DT may be referred to as a D-semiconductor layer DA.

The gate driver 130 may be formed on the substrate SUB. A protective layer PAS may be applied on the substrate SUB on which the gate driver 130 is formed. The protective layer PAS may cover the gate driver 130 and the substrate SUB.

The planarizing layer PL can be continuously applied on the protective layer PAS. The planarizing layer PL may smooth or planarize the substrate SUB on which the protective layer PAS is applied. The switching TFT (not shown) and the driving TFT DT can be applied on the substrate SUB on which the planarizing layer PL is applied.

The semiconductor layer DA of the driving TFT DT may be formed on the planarizing layer PL. The semiconductor layer DA may be overlapped with the gate driver 130. The gate insulator GI can be coated on the planarizing layer PL. The gate insulator GI can cover the semiconductor layer DA. The gate insulator GI can be referred to as a first insulator GI.

The gate electrode DG may be formed on the gate insulator GI. The gate electrode DG may be connected to the gate driver 130 through the gate insulator GI, the planarizing layer PL, and the protective layer PAS. The gate insulator GI, the planarizing layer PL, and the protective layer PAS can form the contact hole H. The gate insulator GI, the planarizing layer PL, and the protective layer PAS can communicate one another via the contact hole H. The gate electrode DG can pass through the contact hole H.

The contact hole H may not penetrate the semiconductor layer DA. The contact hole H may be formed around the semiconductor layer DA. The gate driver 130 may be exposed through the contact hole H. The semiconductor layer DA and the gate electrode DG can be insulated from each other.

An insulator IN can be coated on the gate insulator GI. The insulator IN can cover the gate electrode DG. The insulator IN can be referred to as a second insulator IN.

The source electrode DS and the drain electrode DD may be formed on the second insulator IN. The gate electrode DG may be positioned between the source electrode DS and the drain electrode DD. The gate electrode DG may not overlap the source electrode DS nor the drain electrode DD.

The source electrode DS and the drain electrode DD may go through the second insulator IN and the gate insulator GI. The source electrode DS and the drain electrode DD may be connected to the upper surface of the semiconductor layer DA.

For example, the source electrode DS may be connected to the upper surface of the semiconductor layer DA. The semiconductor layer DA which is connected to the source electrode DS can be referred to as a first semiconductor layer DA. For example, the drain electrode DD may be connected to the upper surface of the semiconductor layer DA. The semiconductor layer DA which is connected to the drain electrode DD can be referred to as a second semiconductor layer DA. For example, the source electrode DS and the drain electrode DD may be positioned adjacent to the gate electrode DG.

The protective layer PAS can be coated on the second insulator IN. The protective layer PAS can cover the driving TFT DT. The protective layer PAS may be applied on both the display area AA and the non-display area NA. The plurality of contact holes H may be formed through the protective layer PAS. The drain electrode DD of the driving TFT DT in the display area AA can be exposed through the contact hole H. The gate pad GP (see FIG. 4) and the data pad DP (see FIG. 3) in the non-display area can be exposed through the contact hole H.

The planarizing layer PL may be applied on the protective layer PAS. The planarizing film PL can be applied only on the display area AA of the substrate SUB. The planarizing layer PL may make the upper surface of the substrate SUB smooth. The organic material constituting the organic light emitting diode OLED can be applied on the smooth surface of the planarizing layer PL.

The anode electrode ANO may be formed on the planarizing layer PL. The anode electrode ANO may pass through the planarizing layer PL and the protective layer PAS. The anode electrode ANO may be connected to the drain electrode DD of the driving TFT DT.

The organic light emitting layer OL may be formed on the anode electrode ANO.

The cathode electrode CAT may be formed on the organic light emitting layer OL.

Although the driving TFT DT described above has been described as a top gate structure, it is not limited thereto.

Referring to FIG. 6, a plurality of G-TFTs GT may be selectively operated by receiving a driving signal or a control signal under the control of a timing controller. The G-TFT GT can supply a scan signal to the pixel selected by the switching TFT (not shown). In FIG. 6, the gate driver is briefly shown as one G-TFT (GT), and a description thereof will be mainly described.

The G-TFT GT may include a gate electrode GG, a semiconductor layer GA, a source electrode GS, and a drain electrode GD. The drain electrode GD may be connected to the gate electrode DG of the driving TFT DT. The gate electrode GG of the gate TFT GT may be referred to as a G-gate electrode. The semiconductor layer GA of the gate TFT GT may be referred to as a G-semiconductor layer GA. The source electrode GS of the gate TFT GT may be referred to as a G-source electrode GS. The drain electrode GD of the gate TFT GT may be referred to as a G-drain electrode GD.

The semiconductor layer GA of the G-TFT GT may be formed on the substrate SUB.

The gate insulator GI may be coated on the substrate SUB. The first insulator GI may cover the semiconductor layer GA. The 'first insulator' GI layered on the substrate SUB may be referred to as a 'lower first insulator' GI. The lower first insulator GI may be adjacent to the gate TFT GT. The lower first insulator GI may be in contact on the gate TFT GT.

The gate electrode GG may be formed on the gate insulator GI. The gate electrode GG may overlap the central portion of the semiconductor layer GA.

The insulator IN may cover the gate electrode GG. The second insulator IN may be applied on the first insulator GI. The second insulator IN layered on the lower first insulator may be referred to as a lower second insulator IN.

The source electrode GS and the drain electrode GD may be formed on the second insulator IN. The gate electrode GG may be positioned between the source electrode GS and the drain electrode GD.

The source electrode GS and the drain electrode GD can penetrate the second insulator IN and the first insulator GI. The source electrode GS and the drain electrode GD may be connected to the upper surface of the semiconductor layer GA.

The process of forming the G-TFT GT may be substantially the same as the process of forming the driving TFT DT.

The protective layer PAS can be coated on the second insulator IN. The protective layer PAS can cover the G-TFT GT. The protective layer PAS covering the gate TFT GT may be referred to as a lower protective layer PAS.

The planarizing layer PL can be continuously applied on the protective layer PAS. The driving TFT DT can be applied to the planarizing layer PL. The planarizing layer PL layered on the lower protective layer PAS may be referred to as a lower planarizing layer PL.

The semiconductor layer DA of the driving TFT DT can be formed on the lower planarizing layer PL. The semiconductor layer DA of the driving TFT DT may overlap the G-TFT GT.

The gate insulator GI may cover the semiconductor layer DA. The first insulator GI can be applied on the planarizing layer PL. The gate insulator GI connected to the D-semiconductor layer DA may be referred to as an upper first insulator GI.

The gate insulator GI may cover the semiconductor layer DA. The first insulator GI can be applied on the planarizing film PL.

The contact hole H may be formed in the gate insulator GI, the planarizing layer PL, and the protective layer PAS. The drain electrode GD of the G-TFT can be exposed through the contact hole H. The contact hole H may be formed adjacent to the semiconductor layer DA. The semiconductor layer DA and the gate electrode DG can be insulated from each other.

The gate electrode DG may be connected to the drain electrode GD of the G-TFT. The gate electrode DG may be inserted into the contact hole H.

The second insulator IN can be coated on the first insulator GI. The second insulator IN can cover the gate electrode DG.

The source electrode DS and the drain electrode DD may be formed on the second insulator IN. The gate electrode DG may be formed between the source electrode DS and the drain electrode DD. The gate electrode DG may not overlap the source electrode DS in the stacking direction. The gate electrode DG may not overlap the drain electrode DD in the stacking direction. The second insulator IN covering the upper first insulator GI may be referred to as an upper second insulator IN.

The source electrode DS and the drain electrode DD can penetrate the second insulator IN and the first insulator GI. The source electrode DS and the drain electrode DD may be connected to the upper surface of the semiconductor layer DA.

The source electrode DS may be connected to the upper surface of the semiconductor layer DA located adjacent to the gate electrode DG. The drain electrode DD may be connected to the upper surface of the semiconductor layer DA located adjacent to the gate electrode DG. The semiconductor layer DA connected to the source electrode DS may be spaced apart from the semiconductor layer DA connected to the drain electrode DD.

The protective layer PAS can be coated on the second insulator IN. The protective layer PAS can cover the driving TFT DT. The drain electrode DD of the driving TFT DT can be exposed through the opening formed in the protective layer PAS. The protective layer PAS connected to the driving TFT DT may be referred to as a upper protective layer PAS.

The planarizing layer PL may be applied on the protective layer PAS. The planarizing layer PL covering the upper protective layer PAS may be referred to as an upper planarizing layer PL.

The anode electrode ANO may be formed on the planarizing layer PL. The anode electrode ANO can pass through the planarizing layer PL and the protective layer PAS. The anode electrode ANO may be connected to the drain electrode DD of the driving TFT DT.

The bank BA can be applied on the planarizing layer PL. The bank BA may be applied to an area other than the pixel PXL on the display area. The bank BA can compartmentalize each pixel. The bank BA may be referred to as a pixel defining layer. The bank BA may include an organic material. For example, the bank BA may include at least one of a polyimide series, and a polyacryl series.

The organic light emitting layer OL may be formed on the anode electrode ANO. The region of the anode electrode ANO on which the organic light emitting layer OL, may be not covered by the bank BA.

The cathode electrode CAT may be formed on the organic light emitting layer OL and the bank BA. The cathode electrode CAT may cover the organic light emitting layer OL and the bank BA. The cathode electrode CAT may be formed on the display area AA. The cathode electrode CAT may be depressed at the place where the organic light emitting layer OL is located.

In FIG. 6, the G-TFT GT and the driving TFT DT are described as a top gate structure, but the present invention is not limited thereto.

Figure 7:
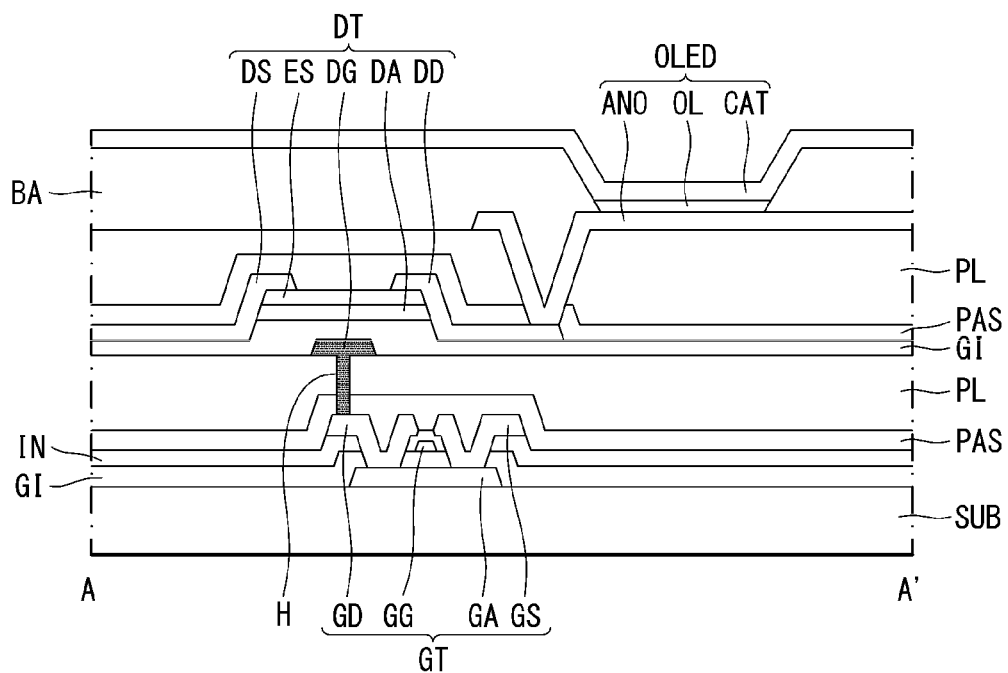

Referring to FIG. 7, the G-TFT GT formed in the pixel PXL may include a gate electrode GG, a semiconductor layer GA, a source electrode GS, and a drain electrode GD. The drain electrode GD of the G-TFT GT may be connected to the drain electrode DD of the driving TFT DT.

The semiconductor layer GA of the G-TFT GT may be formed on the substrate SUB.

The first insulator GI may cover the semiconductor layer GA. The first insulator GI may be applied on the substrate SUB.

The gate electrode GG may be formed on the first insulator GI. The gate electrode GG may overlap the central portion of the semiconductor layer GA in the stacking direction.

The insulator IN may cover the gate electrode GG. The second insulator IN can be applied on the first insulator GI.

The source electrode GS and the drain electrode GD may be formed on the second insulator IN. The gate electrode GG may be formed between the source electrode GS and the drain electrode GD.

The source electrode GS and the drain electrode GD may be inserted into the insulating film IN and the gate insulating film GI. The source electrode GS and the drain electrode GD may be connected to the upper surface of the semiconductor layer GA.

The protective layer PAS can be coated on the second insulator IN. The protective layer PAS can cover the G-TFT GT.

The planarizing layer PL may be applied on the protective layer PAS.

The driving TFT DT formed on the pixel PXL may be formed on the planarizing layer PL. The driving TFT DT may include a gate electrode DG, a semiconductor layer DA, an etch stopper layer ES, a source electrode DS and a drain electrode DD. The etch stopper layer ES may protect the semiconductor layer DA from being damaged by etching. The etch stopper layer ES may be referred to as a D-etch stopper layer ES.

The contact hole H can be formed in the planarization layer PL and the protective layer PAS. The drain electrode GD of the G-TFT GT can be exposed through the contact hole H. The gate electrode DG of the driving TFT DT can pass through the contact hole H. The gate electrode DG of the driving TFT DT can be connected to or contacted with the drain electrode GD of the G-TFT GT. The gate electrode DG of the driving TFT DT may overlap with the drain electrode GD of the G-TFT GT in the stacking direction.

The protective layer PAS can be coated on the first insulator GI. The protective layer PAS can cover the driving TFT DT.

The planarizing layer PL can be continuously applied on the protective layer PAS.

The anode electrode ANO may be formed on the planarizing layer PL. The anode electrode ANO may be formed in an isolated rectangular shape, wherein the anode electrode ANO may occupy only a certain portion of the pixel PXL. The anode electrode ANO can make contact with the drain electrode DD of the driving TFT DT through a hole formed in the protective layer PAS and the planarizing layer PL.

The bank BA may be formed on the planarizing layer PL on which the anode electrode ANO is formed. The bank BA may be patterned to form a light emitting region. The anode electrode ANO may be exposed at the light emitting region.

The organic light emitting layer OL may be formed on the anode electrode ANO exposed by pattering of the bank BA. The cathode electrode CAT may cover the bank BA and the organic light emitting layer OL. The cathode electrode CAT may include a transparent conductive material.

In FIG. 7, the G-TFT GT is described as a top gate structure and the driving TFT DT is described as a bottom gate structure.

Figure 8:
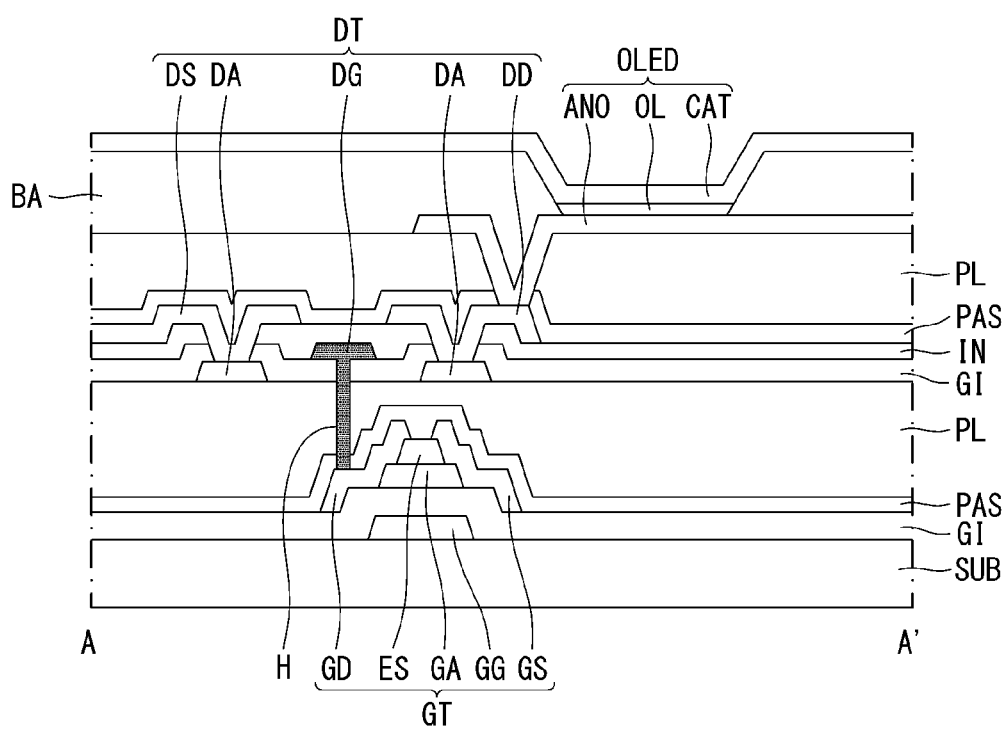

Referring to FIG. 8, the G-TFT GT may include a gate electrode GG, a semiconductor layer GA, an etch stopper layer ES, a source electrode GS, and a drain electrode GD. The G-TFT GT may be formed in the pixel PXL.

The gate electrode GG of the G-TFT GT may be formed on the substrate SUB.

The first insulator GI may be coated on the substrate SUB. The first insulator GI may cover the gate electrode GG.

The semiconductor layer GA may be formed on the first insulator GI. The semiconductor layer GA may overlap the gate electrode GG. In particular, the semiconductor layer GA may overlap the gate electrode GG in the stacking direction.

The etch stopper layer ES may be formed on the semiconductor layer GA. The etch stopper layer ES may cover the semiconductor layer GA. The etch stopper layer ES may be formed between the semiconductor layer GA and the source electrode GS or the drain electrode GD. The etch stopper layer ES can prevent the semiconductor layer GA from being damaged when the source electrode GS or the drain electrode GD is etched. The etch stopper layer ES formed on the G-semiconductor layer GA may be referred to as a G-etch stopper layer ES.

The source electrode GS and the drain electrode GD may cover the semiconductor layer GA and the etch stopper layer ES. The semiconductor layer GA and the etch stopper layer ES may be located between the source electrode GS and the drain electrode GD. The source electrode GS may be symmetrical with the drain electrode GD. The source electrode GS and the drain electrode GD can be separated by an etching process after being formed integrally. The etch stopper layer ES can protect the semiconductor layer GA during the etching process.

The protective layer PAS may be applied on the first insulator GI. The protective layer PAS may cover the G-TFT GT.

The planarization layer PL may be applied on the protective layer PAS.

The driving TFT DT may be formed in the pixel. The driving TFT DT may include a gate electrode DG, a semiconductor layer DA, a source electrode DS, and a drain electrode DD. Detailed description of the driving TFT DT is introduced with reference to FIG. 6.

The driving TFT DT may be formed on the planarizing layer PL. The driving TFT DT can be stacked over the G-TFT GT.

The gate electrode DG of the driving TFT DT can be connected to the drain electrode GD of the gate G-TFT GT through the contact hole H.

The contact hole H may be formed in the first insulator GI, the planarizing layer PL, and the protective layer PAS. The first insulator GI, the planarizing layer PL, and the protective layer PAS can be communicated through the contact holes H. The drain electrode GD of the G-TFT can be located at the entrance of the contact hole H. The gate electrode DG of the driving TFT DT can be insulated from the semiconductor layer DA of the driving TFT DT.

The gate electrode DG of the driving TFT DT can be connected to the drain electrode GD of the G-TFT GT.

The protective layer PAS can cover the driving TFT DT. The protective layer PAS can be applied on the second insulator IN.

The planarizing layer PL can be applied on the protective layer PAS.

The anode electrode ANO may be formed on the planarizing layer PL. The anode electrode ANO may be formed in an isolated rectangular shape. The anode electrode ANO may occupy a certain portion of the pixel PXL. The anode electrode ANO may go through the protective film PAS and the flattening film PL and then may be in contact with the drain electrode DD of the driving TFT DT.

The bank BA may be formed on the planarizing layer PL on which the anode electrode ANO is formed. The bank BA may be patterned to form a light emitting region. The anode electrode ANO may be exposed at the light emitting region.

The organic light emitting layer OL may be formed on the anode electrode ANO exposed by patterning of the bank BA. The cathode electrode CAT may cover the bank BA and the organic light emitting layer OL. The cathode electrode CAT may include a transparent conductive material.

In FIG. 7, the G-TFT GT is described as a bottom gate structure and the driving TFT DT is described as a top gate structure.

Figure 9:
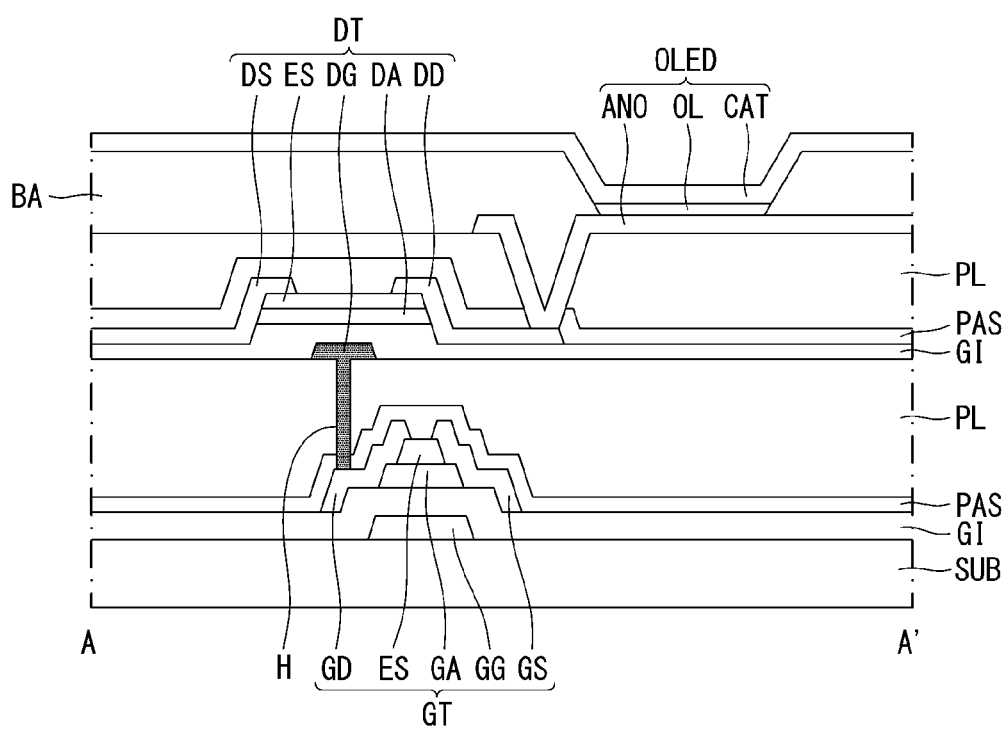

Referring to FIG. 9, the G-TFT GT may include a gate electrode GG, a semiconductor layer GA, an etch stopper layer ES, a source electrode GS, and a drain electrode GD. The G-TFT GT may be formed in the pixel PXL.

The gate electrode GG of the G-TFT GT may be formed on the substrate SUB.

The first insulator GI may be applied on the substrate SUB. The first insulator GI may cover the gate electrode GG.

The semiconductor layer GA may be formed on the first insulator GI. The semiconductor layer GA may overlap the gate electrode GG. In particular, the semiconductor layer GA may overlap the gate electrode GG in the stacking direction.

The etch stopper layer ES may be formed on the semiconductor layer GA. The etch stopper layer ES may cover the semiconductor layer GA. The etch stopper layer ES may be formed between the semiconductor layer GA and the source electrode GS or the drain electrode GD. The etch stopper layer ES can prevent the semiconductor layer GA from being damaged when the source electrode GS or the drain electrode GD is etched.

The source electrode GS and the drain electrode GD may cover the semiconductor layer GA and the etch stopper layer ES. The semiconductor layer GA and the etch stopper layer ES may be located between the source electrode GS and the drain electrode GD. The source electrode GS may be symmetrical with the drain electrode GD. The source electrode GS and the drain electrode GD can be separated by an etching process after being formed integrally. The etch stopper layer ES can protect the semiconductor layer GA during the etching process.

The protective layer PAS may be applied on the first insulator GI. The protective layer PAS may cover the G-TFT GT.

The planarization layer PL may be applied on the protective layer PAS.

The driving TFT DT located in the pixel PXL may be formed on the planarizing layer PL. The driving TFT DT may include a gate electrode DG, a semiconductor layer DA, an etch stopper layer ES, a source electrode DS, and a drain electrode DD.

The contact holes H may be formed in the planarization layer PL and the protective layer PAS. The drain electrode GD of the G-TFT GT may be located at the entrance of the contact hole H. The drain electrode GD of the G-TFT GT can be exposed through the contact hole H. The gate electrode DG of the driving TFT DT can be inserted into the contact hole H. The gate electrode DG of the driving TFT DT can be connected to or in contact with the drain electrode GD of the G-TFT GT. The gate electrode DG of the driving TFT DT may overlap with the drain electrode GD of the G-TFT GT. In particular, the gate electrode DG of the driving TFT DT can be overlapped with the drain electrode GD of the G-TFT GT in the stacking direction.

The protective layer PAS may cover the driving TFT DT. The protective layer PAS may be applied on the first insulator GI.

The planarizing layer PL may be applied to the protective layer PAS.

The anode electrode ANO may be formed on the planarizing layer PL. The anode electrode ANO may be formed in an isolated rectangular shape, wherein the anode electrode ANO may occupy only a certain portion of the pixel PXL. The anode electrode ANO can make contact with the drain electrode DD of the driving TFT DT through a hole formed in the protective layer PAS and the planarizing layer PL.

The bank BA may be formed on the planarizing layer PL on which the anode electrode ANO is formed. The bank BA may be patterned to form a light emitting region. The anode electrode ANO may be exposed at the light emitting region.

The organic light emitting layer OL may be formed on the anode electrode ANO exposed by patterning of the bank BA. The cathode electrode CAT may cover the bank BA and the organic light emitting layer OL. The cathode electrode CAT may include a transparent conductive material.

In FIG. 9, the G-TFT GT and the driving TFT DT are described as a bottom gate structure.

Figure 10:
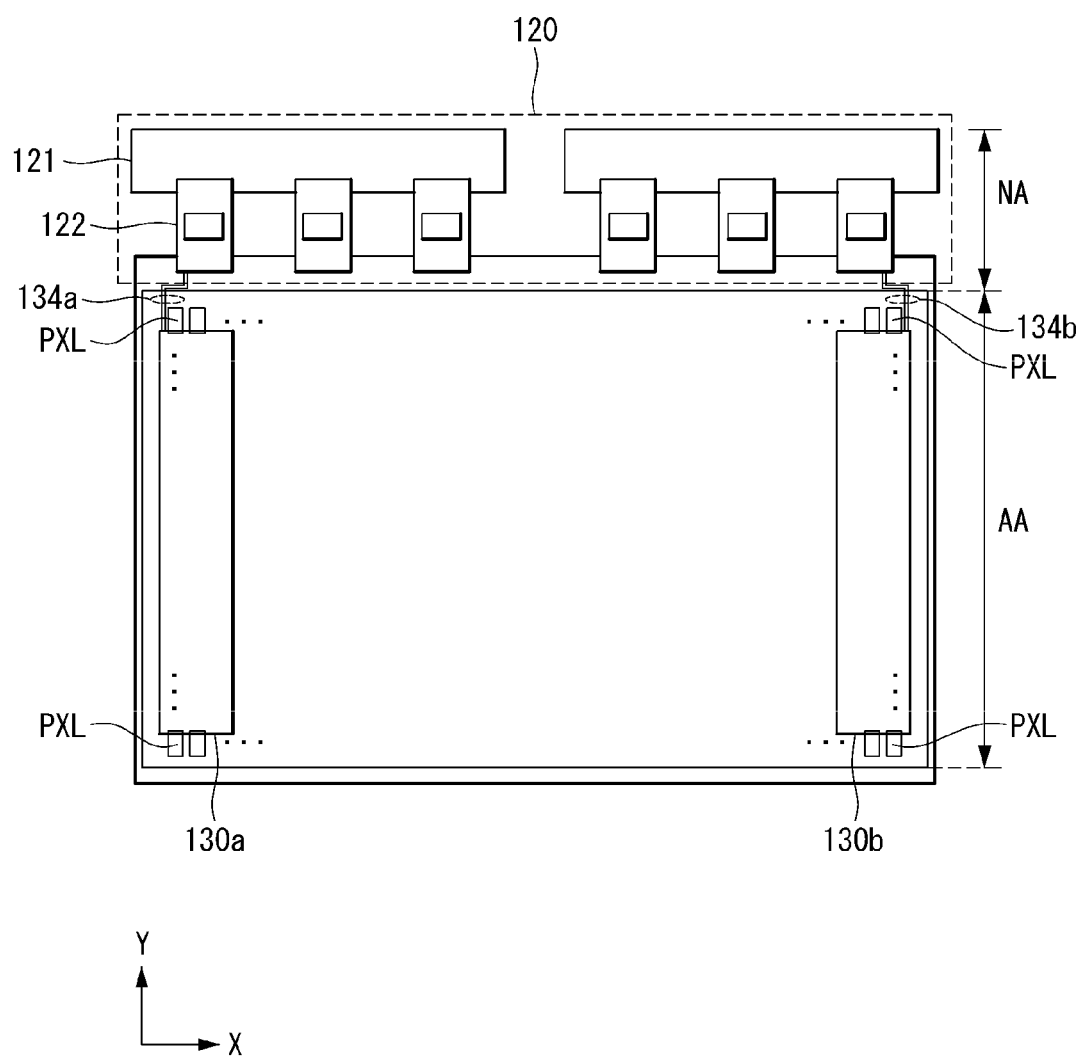
FIG. 10 is a view illustrating a display device according to an embodiment of the present invention.

Referring to FIG. 10, the display panel 100 may include a substrate SUB. The substrate SUB may be divided into a display area AA and a non-display area NA. The display area AA can display an image of input digital video data. Various electronic components for driving the display area AA can be disposed in the non-display area NA. The non-display area NA can be referred to as a bezel area.

The plurality of pixels PXL may be arranged on the display area AA in a matrix form. For example, the plurality of pixels PXL may be arranged in M×N rectangular shape. M and N can be natural numbers.

A gate driver 130a and 130b may be disposed on the display area AA. The gate driver 130a and 130b may be elongated along a column direction Y of the display area AA. The gate driver 130a and 130b can be referred to as a GIP (Gate In Panel) 130a and 130b.

The gate driver 130a and 130b may include a first gate driver 130a and a second gate driver 130b.

The first gate driver 130a can be embedded in the substrate SUB. The first gate driver 130a can be positioned at a side of the substrate SUB.

The first gate driver 130a can be electrically connected to a plurality of wires 134a. The plurality of wires 134a can carry a driving signal or control signal to the first gate driver 130a. The plurality of wires 134a can be electrically connected to the data driver 120 and the source COF 122. The plurality of wires 134a which is connected to the first gate driver 130a may be referred to as first wires 134a. The source COF 122 which is connected to the first wires 134a may be referred to as a first source COF 122. The data driver 121 which is connected to the first source COF 122 may be referred to as a first data driver 121.

The plurality of wires 134a may be connected to the source COF (Chip On Film) 122 disposed closest to the periphery of the first gate driver 130a in consideration of noise and signal delay.

The driving signal or the control signal may be supplied to the first gate driver 130a via the data driver 120, the source COF (Chip On Film) 122 and the plurality of wires 134a.

The second gate driver 130b can be embedded in the substrate SUB. The second gate driver 130b can be positioned at another side of the substrate SUB. The second gate driver 130b may be opposite to the first gate driver 130a in right-left direction X.

The second gate driver 130b can be electrically connected to a plurality of wires 134b. The plurality of wires 134b can carry a driving signal or control signal to the second gate driver 130b. The plurality of wires 134b can be electrically connected to the data driver 120 and the source COF 122. The plurality of wires 134b which is connected to the second gate driver 130b may be referred to as second wires 134b. The source COF 122 which is connected to the second wires 134b may be referred to as a second source COF 122. The data driver 121 which is connected to the second source COF 122 may be referred to as a second data driver 121.

The plurality of wires 134b may be connected to the source COF (Chip On Film) 122 disposed closest to the periphery of the second gate driver 130b in consideration of noise and signal delay.

The driving signal or the control signal may be supplied to the second gate driver 130b via the data driver 120, the source COF (Chip On Film) 122 and the plurality of wires 134a.

The non-display area NA can be disposed on the periphery of the pixel array or around the pixel PXL. The non-display area NA may be disposed on a side of the pixel PXL in the column direction. A data driver 120 may be disposed on the non-display area NA. The data driver 120 may be referred to as a DIC (Data Driving Integrated Circuit) 120.

The first and second gate drivers 130a and 130b may be positioned at left and right on the display area AA. The first and second gate drivers 130a and 130b can operate the display panel partly. For example, the first gate driver 130a may operate a portion of the display panel and the second gate driver 130b may operate another portion of the display panel.

The first and second gate driver 130a and 130b can be positioned on the display area AA. Therefore there may be no necessary to form additional non-display area NA positioned at left or right of the display area AA.

Certain embodiments or other embodiments of the invention described above are not mutually exclusive or distinct from each other. Any or all elements of the embodiments of the invention described above may be combined or combined with each other in configuration or function.

For example, a configuration "A" described in one embodiment of the invention and the drawings and a configuration "B" described in another embodiment of the invention and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
a substrate including a display area and a non-display area adjacent to the display area;
a plurality of pixels included in pixel areas defined by a plurality of gate lines, that is arranged in a horizontal direction in the display area on the substrate, and a plurality of data lines that is arranged in a vertical direction in the display area on the substrate; and
a gate driver positioned in the display area on the substrate and extended in the vertical direction along the data lines in a central area of the display area, the gate driver configured to supply a gate signal to the plurality of gate lines,
wherein the gate driver is layered on the substrate,
wherein a driving thin film transistor (TFT) is layered on the gate driver,
wherein the gate driver includes a gate-in panel (GIP) that consists of a plurality of thin film transistors, and
wherein the GIP is disposed below the pixel and is disposed between the substrate and the pixel.

2. The display device of claim 1,
further comprising a data driver being positioned in the non-display area,
wherein the data driver is electrically connected to the gate driver.

3. The display device of claim 1,
wherein the data driver includes:
a first data driver; and
a second data driver being spaced apart from the first data driver.

4. The display device of claim 3,
further comprising a source chip-on film (COF) positioned in the non-display area,
wherein the source COF connects the data driver to the substrate.

5. A display device, comprising:
a substrate including a display area and a non-display area adjacent to the display area;
a plurality of pixels included in pixel areas defined by a plurality of gate lines, that is arranged in a horizontal direction in the display area on the substrate, and a plurality of data lines that is arranged in a vertical direction in the display area on the substrate; and
a gate driver positioned in the display area on the substrate, the gate driver configured to supply a gate signal to the plurality of gate lines,
wherein the gate driver includes a first gate driver and a second gate driver,
wherein the first gate driver is positioned in the display area on the substrate and extended in the vertical direction along the data lines on one side of the display area,
wherein the second gate driver is positioned in the display area on the substrate and extended in the vertical direction along the data lines in another side of the display area,
wherein the first gate driver and the second gate driver include a gate-in panel (GIP) that consists of a plurality of thin film transistors, and wherein the GIP is disposed below the pixel and is disposed between the substrate and the pixel.

6. The display device of claim 5, further comprising a data driver being positioned in the non-display area,
wherein the data driver is electrically connected to the first gate driver and/or the second gate driver.

7. The display device of claim 6, wherein the data driver includes:
a first data driver; and
a second data driver being spaced apart from the first data driver,
wherein the first data driver is electrically connected to the first gate driver,
the second data driver is electrically connected to the second gate driver.

8. The display device of claim 7, further comprising a source COF (Chip On Film) being positioned in the non-display area,
wherein the source COF connects the first and the second data driver to the substrate.

9. The display device of claim 5, wherein the first and second gate drivers receive a driving signal or a control signal under the control of a timing controller and operate to partition the display area.

* * * * *